United States Patent [19]

Kwon et al.

[11] Patent Number: 5,198,985
[45] Date of Patent: Mar. 30, 1993

[54] APPARATUS FOR REMOVING ERRONEOUSLY INSERTED PARTS IN AUTOMATIC INSERTION MACHINE

[75] Inventors: Yong C. Kwon; Ha S. Baik, both of Kyungki, Rep. of Korea

[73] Assignee: Goldstar Co., Ltd., Seoul, Rep. of Korea

[21] Appl. No.: 618,634

[22] Filed: Nov. 27, 1990

[30] Foreign Application Priority Data

Nov. 28, 1989 [KR] Rep. of Korea .............. 17342/1989

[51] Int. Cl.⁵ .................. G06F 15/20; H05K 3/30
[52] U.S. Cl. .................. 364/478; 364/167.01; 29/741
[58] Field of Search .............. 364/468, 478, 491, 469, 364/167.01; 129/740, 707, 709, 741; 29/762

[56] References Cited

U.S. PATENT DOCUMENTS

| | | | |
|---|---|---|---|
| 4,151,945 | 5/1979 | Ragard et al. | 29/740 |
| 4,197,637 | 4/1980 | Honda | 29/741 |
| 4,498,232 | 2/1985 | Ertl | 29/741 |
| 4,759,112 | 7/1988 | McLean et al. | 29/566.3 |
| 5,036,582 | 8/1991 | Usui | 29/740 |

Primary Examiner—Jerry Smith
Assistant Examiner—Paul Gordon
Attorney, Agent, or Firm—Birch, Stewart, Kolasch & Birch

[57] ABSTRACT

An apparatus for removing erroneously inserted parts in an automatic insertion machine which comprises an erroneous part removing mechanism, a control section which is a program logic controller or a microprocessor, a power supply section, and an operation and display section, whereby when any electronic part is poorly inserted, it is detected and the erroneously inserted part is thrown away and a new part is inserted so that an operating time period for remvoing the erroneously inserted part is remarkably reduced and productivity of an automatic part inserting plant is greatly improved.

5 Claims, 7 Drawing Sheets

APPARATUS FOR REMOVING ERRONEOUSLY INSERTED PARTS IN AUTOMATIC INSERTION MACHINE

BACKGROUND OF THE INVENTION

1. Field of the Invention

The present invention relates to an automatic insertion machine for automatically inserting electronic parts such as a transistor and the like and more particularly, to an apparatus for removing erroneously inserted parts for use in an automatic insertion machine, whereby when insertion error of a part occurs during inserting of the part, the part is automatically removed and thereafter automatic operation can be normally executed.

2. Description of the Prior Art

Various types of conventional automatic insertion machines are known such that, when an error in inserting parts occurs, the machine has to be stopped for an operator to remove the erroneously inserted part by hand or by utilizing a special tool, and then the machine is re-started. Since the bad part has to be manually removed, not only is it troublesome and difficult but also in the case of stopping the machine during operation and then re-starting it various switches have to be manually operated to be ON-OFF, the additional operating time is required.

Thus, since the erroneously inserted part has been heretofore removed by complicated manual invention, more operating time is required in order to remove the erroneous parts. Therefore, there has been a disadvantage that the manufacturing quantity of the product is outstandingly decreased.

SUMMARY OF THE INVENTION

Accordingly, it is an object of the present invention to provide an apparatus for removing erroneously inserted parts in an automatic insertion machine which can solve the disadvantage encountered in the conventional apparatus.

Another object of the present invention is to provide an apparatus which comprises an erroneous part removing mechanism which drives a finger for picking up the erroneously inserted part toward up-down and front-rear, a control member which is a program logic controller or a microprocessor for controlling the operation of the erroneous part removing mechanism, an electric power, a supply member for the power source, and an operating and display member including a control panel.

A further object of the present invention relates to an apparatus, which when any electronic part is poorly inserted due to a reason such as bad shape and the like while various electronic parts are being automatically inserted to a printed circuit board which is arranged on an automatic insertion machine and then operated thereby moving linearly at a predetermined speed, the insertion error is detected and the erroneously inserted electronic part is picked up by the finger and the new electronic part is reinserted. Therefore, the erroneous part removing mechanism including the finger is automatically controlled in response to the program of the control section, whereby the erroneously inserted part is automatically removed while various operational conditions are displayed on the operation and display section so that, since the operating time for removing the erroneously inserted part is reduced, productivity of automatic part insertion is improved.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to an apparatus for removing erroneously inserted parts in an automatic insertion machine which comprises a defective or erroneously inserted part removing mechanism, a control section which is a program logic controller or a microprocessor, a power supply section, and an operation and display section, whereby when any electronic part is poorly inserted, it is detected and the defective part is thrown away and the next new part is inserted so that the operating time period for removing the defective or erroneously inserted part is remarkably reduced and productivity of an automatic part inserting plant is greatly improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
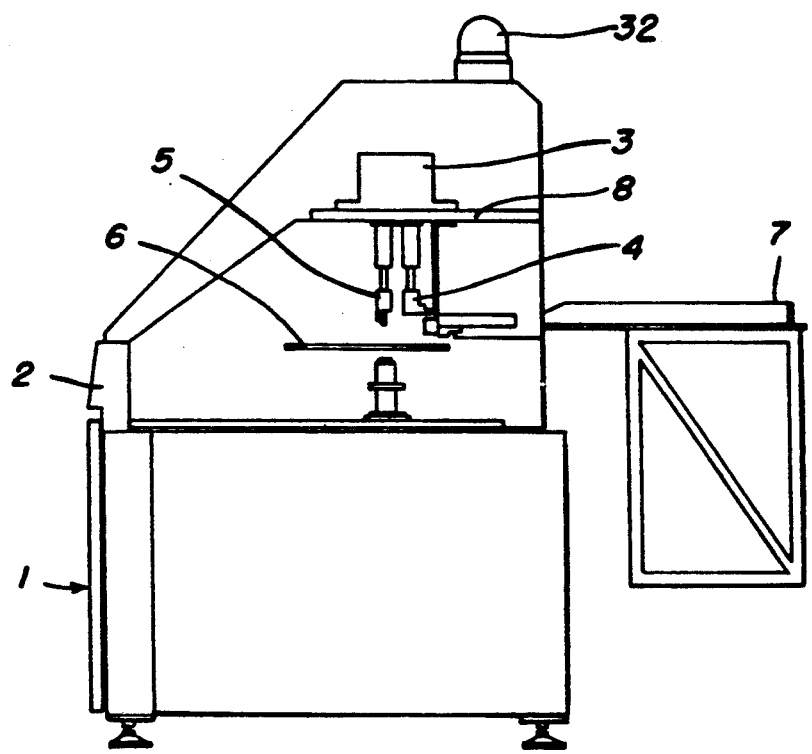
FIG. 1 is a side elevational view of the automatic insertion machine applied with the apparatus of the present invention.
Figure 2:
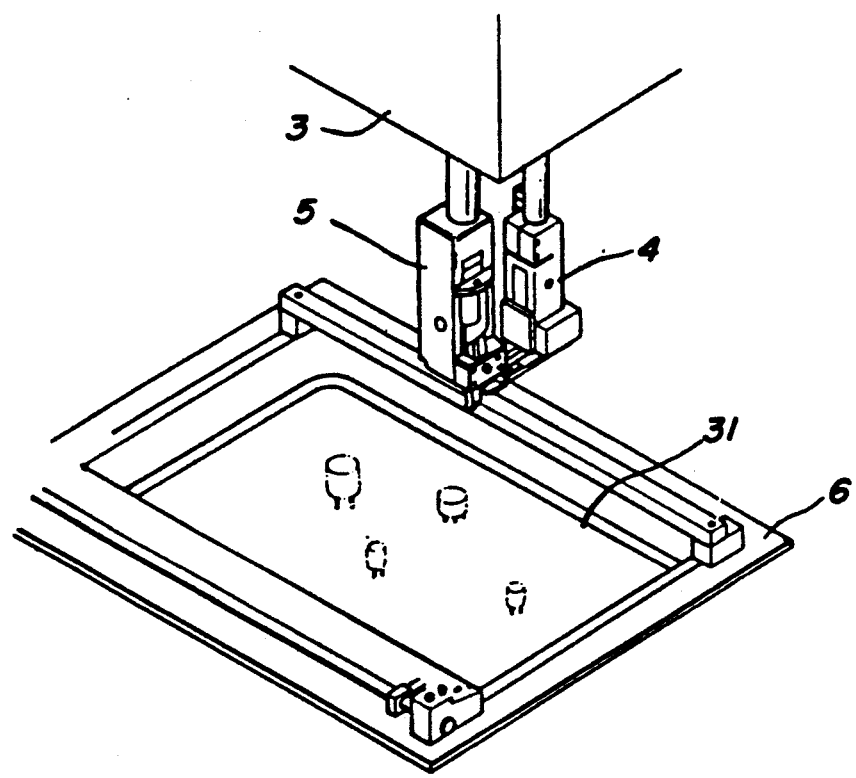
FIG. 2 is a fragmentary perspective view of the apparatus showing the basic construction of the present invention.
Figure 3:
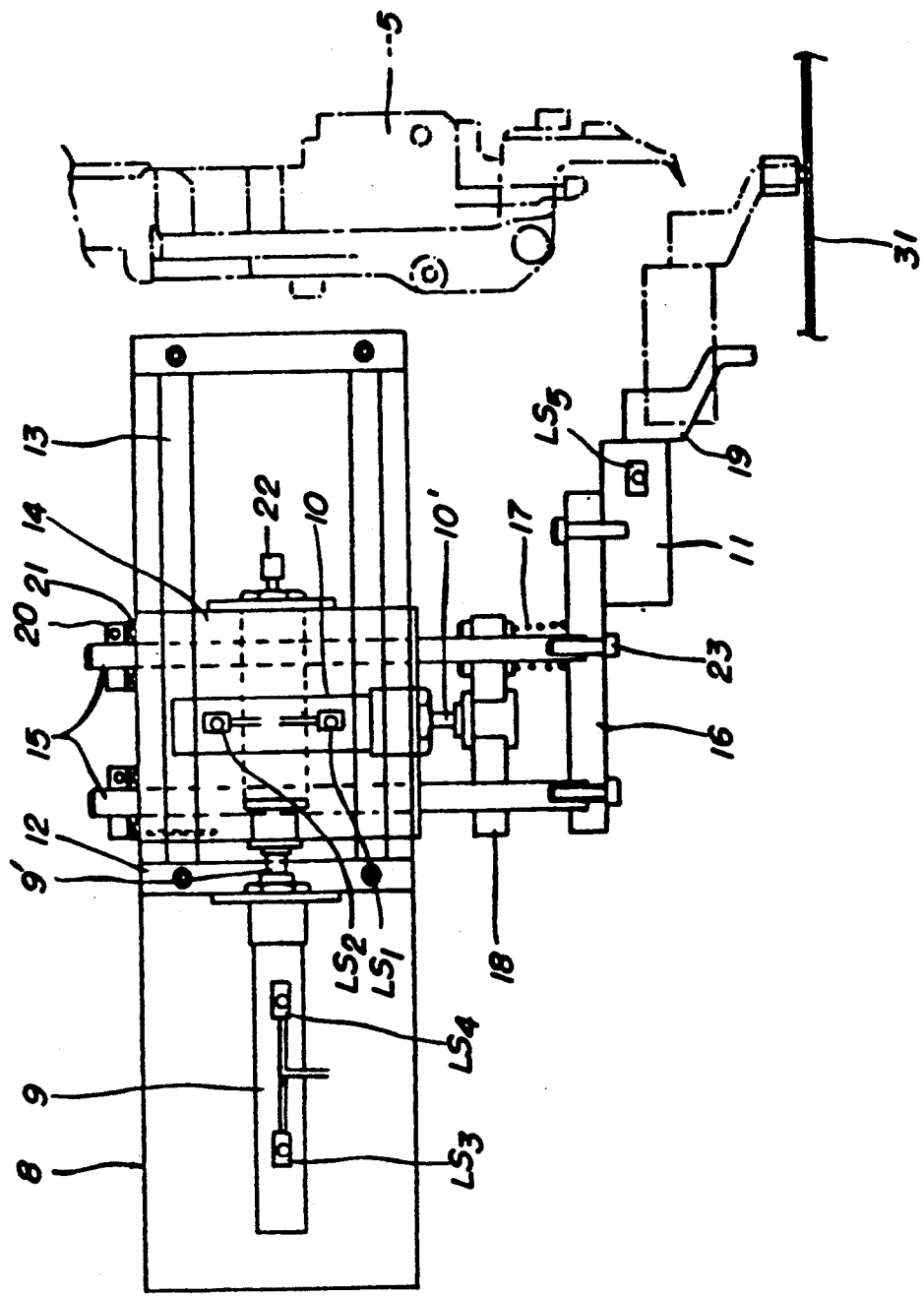
FIG. 3 is a front elevational view of the apparatus showing the basic construction of the present invention.

Referring now in detail to the drawings for the purpose of illustrating preferred embodiments of the present invention, the apparatus for removing erroneously inserted parts in an automatic insertion machine as shown in FIGS. 1, 2, and 3, comprises a main body 1, a control panel 2, and an inserting head 3. A part transferring chuck 4 and a part inserting chuck 5 are provided at the bottom of the inserting head 3. A table 6 which is movable in X - Y directions is arranged under chucks 4 and 5. A parts feeding unit 7 for feeding part is provided at the rear of the main body 1.

The transferring chuck 4 and inserting chuck 5 are connected to a moving base 8 to thereby be made to move together with the base 8. A driving solenoid is mounted to the moving base 8 which includes a forwardly and backwardly moving cylinder 9, an ascending and descending cylinder 10, and a finger driving cylinder 11 driven by compressed air for moving in cooperation therewith.

Reviewing in detail the coupled structure of the forwardly and backwardly moving cylinder 9, ascending and descending cylinder 10, and finger driving cylinder 11, a fixing board 12 is firmly fixed to the moving base 8, the forwardly and backwardly moving cylinder 9 is fixed to the fixing board 12, a pair of rails 13 are longitudinally fixed to one side of the fixing board 12 and a moving plate 14 is coupled to the rails 13 so as to slide longitudinally thereon. A plunger 9' of the forwardly and backwardly moving cylinder 9 is fixed to the moving plate 14 so that the moving plate 14 is made to move in response to the extension and contraction of the plunger 9'.

The ascending and descending cylinder 10 is coupled to the moving plate 14 and a pair of ascending and descending rods 15 are movably mounted at both sides of the ascending and descending cylinder 10 on the moving plate 14 so that the moving plate 14 may be ascended and descended. The fixing plate 16 is fixed to the bottom ends of the ascending and descending rods 15 and a connecting plate 18 is movably coupled through a spring 17 to the top sides thereof, and simultaneously a plunger 10' of the ascending and descending cylinder 10 is fixed to the connecting plate 18 so that the fixing plate 16 is ascended and descended in response to the extension and contraction of the ascending and descending cylinder 10.

The finger driving cylinder 11 is fixed to the fixing plate 16 and a finger 19 for removing an erroneously inserted part is coupled to the finger driving cylinder 11.

To the forwardly and backwardly moving cylinder 9, there are fixed forward movement confirming means LS3 and backward movement confirming means LS4, and descent confirming means LS2 and ascent confirming means LS1 are fixed to the ascending and descending cylinder 10. Chucking confirming means LS5 is fixed to the finger driving cylinder 11. The means LS denotes a limit switch or other sensing switch.

In the drawings, reference numeral 20 represents a stopper for limiting the movement of the ascending and descending rods 15, reference numeral 21 is polyurethane, reference numeral 22 is an absorber, reference numerals 23, 31, and 32 represent a bolt, a printed circuit board, and NG signal lamp, respectively.

Figure 4:
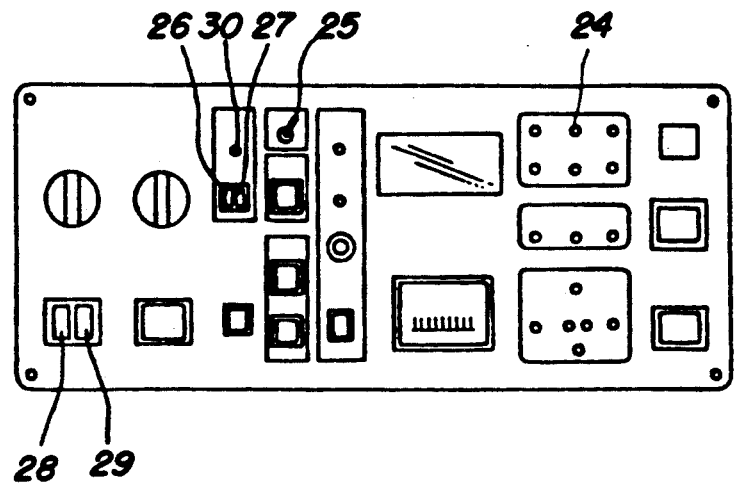
FIG. 4 is a structural diagram of a control panel according to the present invention.

As shown in FIG. 4, the control panel 2 is provided with an insertion error LED 24 to be illuminated when the insertion error is detected by a conventional insertion error detecting device, a servo lock release 25 for selecting the automatic control, recovery switches 26 and 27, automatic insertion movement starting switches 28 and 29, and a recovery OK LED 30.

The normal automatic insertion machine is programmed with about 150-200 parts in the control unit by kind and function, for example, when it is structured in such a manner that assuming that No. 15 process is a transistor inserting process and No. 16 process is a ceramic capacitor inserting process, the transferring chuck 4 picks up the transistor and transfers it to the inserting chuck 5. Thereafter, the transferring chuck 4 again picks up the ceramic capacitor for the purpose of No. 16 process. When any error occurs during the No. 15 process, the transferring chuck 4 throws away the ceramic capacitor of the No. 16 process and then picks up the transistor of the No. 15 process. This function is called a recovery function and is carried out when the recovery switches 26 and 27 are turned ON, whereby the recovery OK LED 30 is illuminated.

Figure 5:
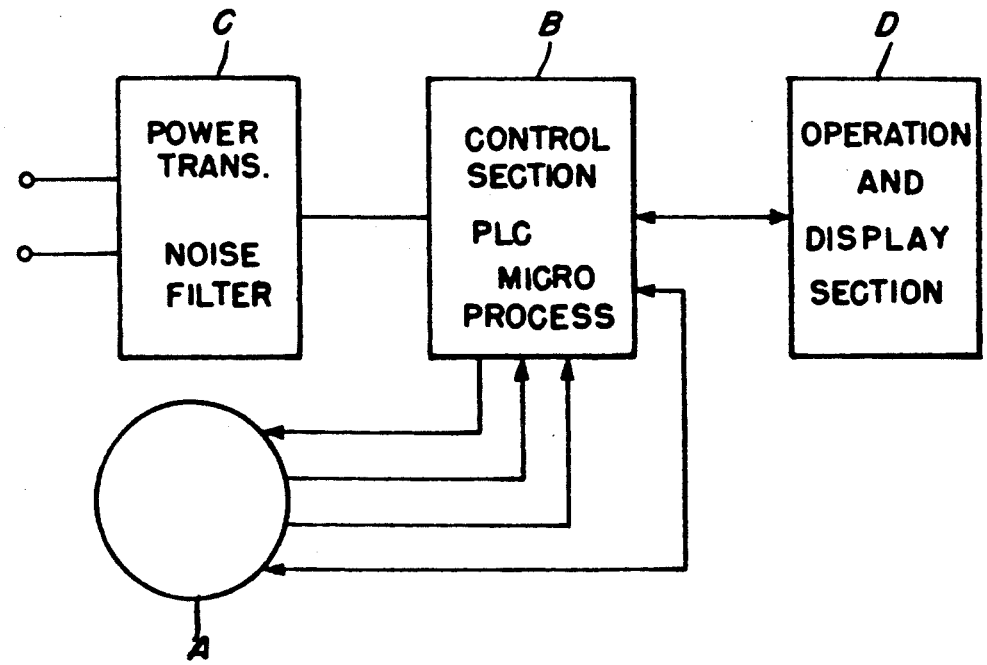
FIG. 5 is a systematic block diagram according to the present invention.

As shown in FIG. 5, a control section B is a program logic controller (hereinafter "PLC") or a microprocessor for controlling the operation of the insertion error part removing mechanism A for the aforementioned erroneously inserted part elimination. An electric power supply section C contains a noise filter and the like and an operation and display section D including the aforementioned control panel.

Figure 6:
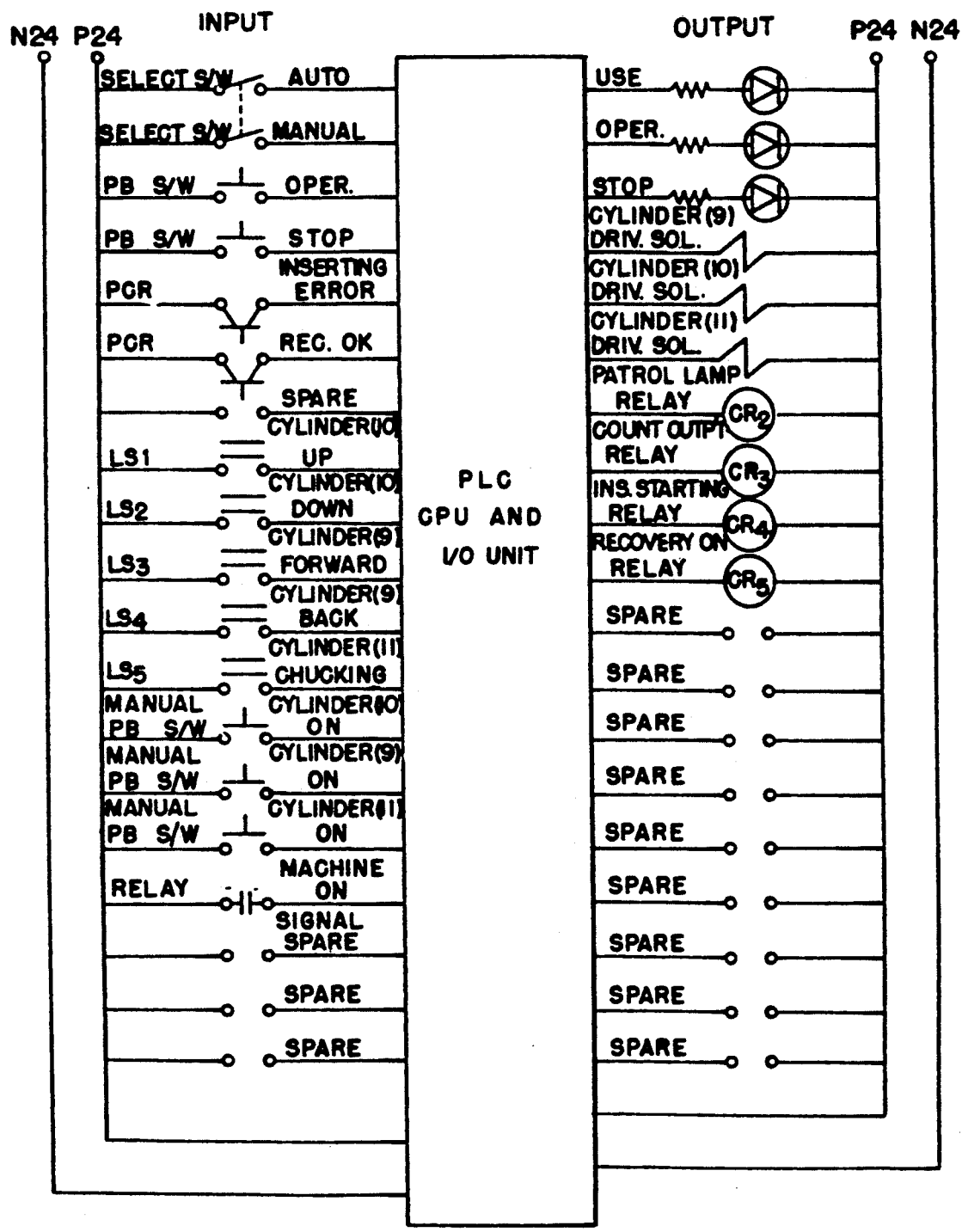
FIG. 6 is a circuit diagram of a control member according to the present invention.
Figure 7:
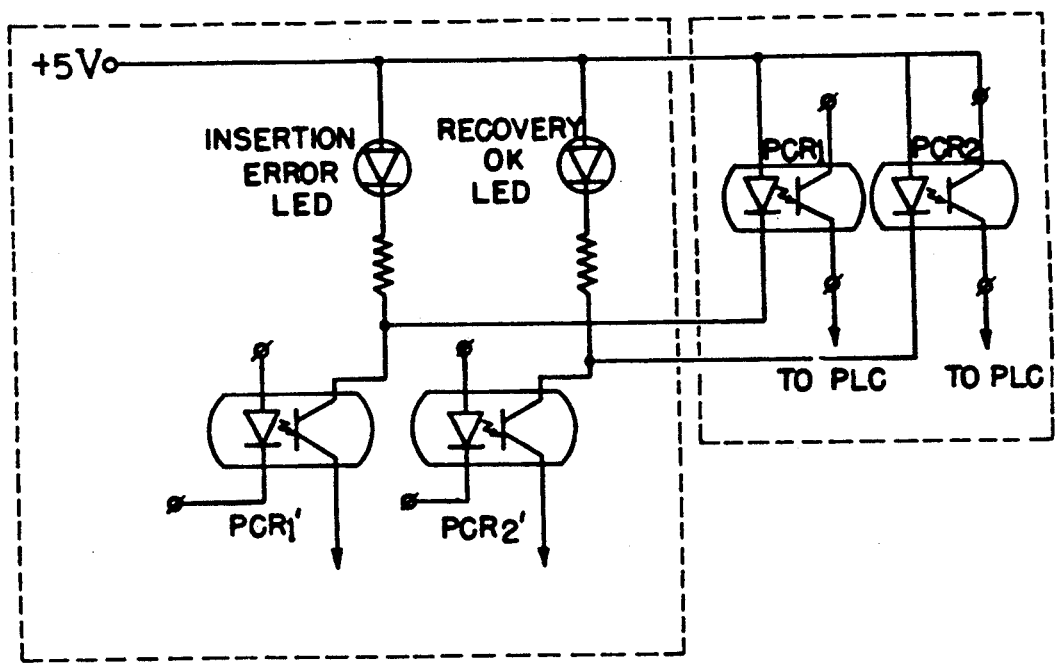
FIG. 7 is a circuit diagram for judging a normal signal of insertion error and recovery according to the present invention.
Figure 8:
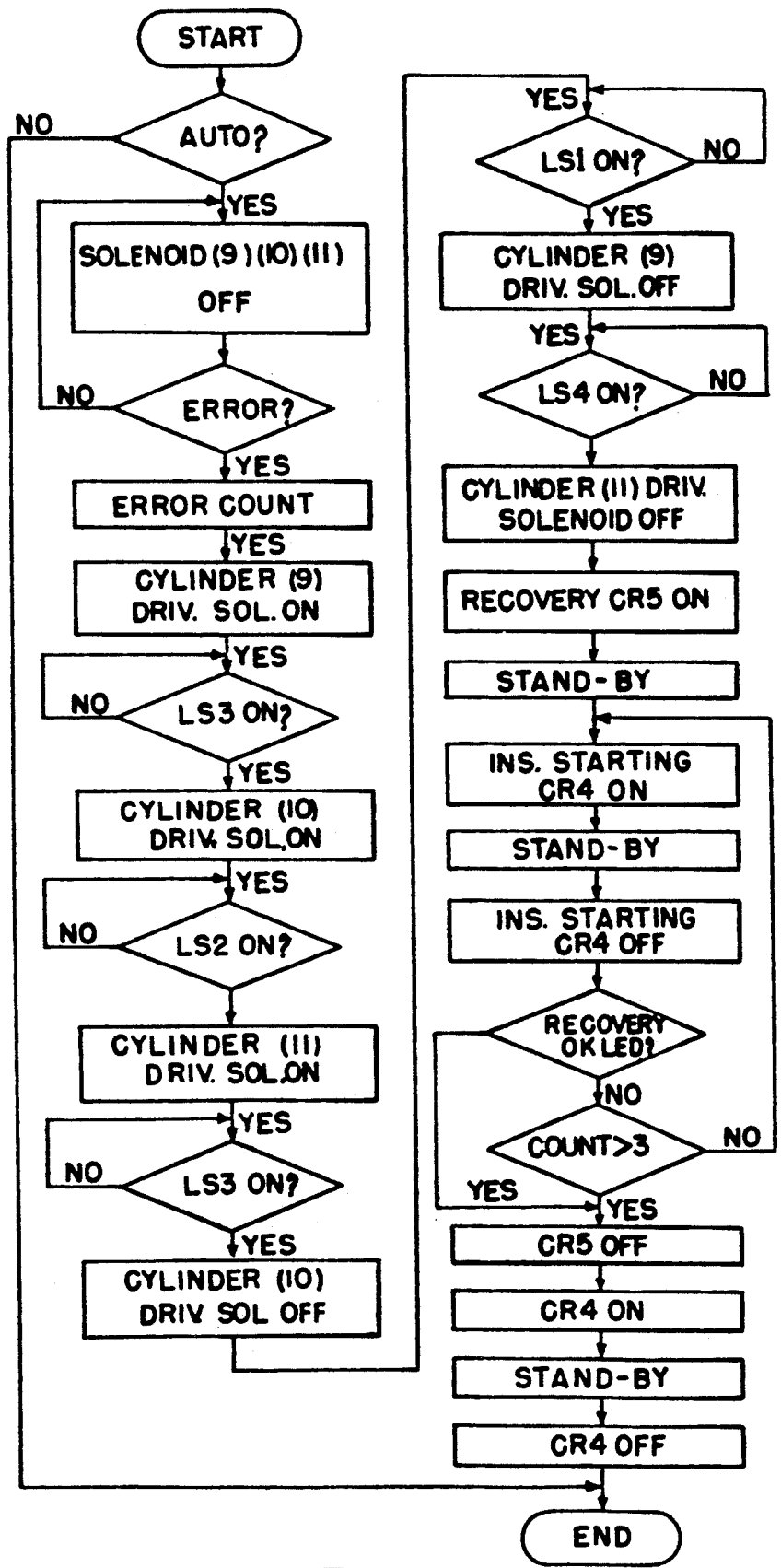
FIG. 8 is a flow chart of the control according to the present invention.

FIG. 6 is a circuit diagram of the control member of the present invention and FIG. 7 is a circuit diagram for judging the insertion error and recovery OK signal according to the present invention. FIG. 8 is a flow chart of the control of the present invention. The operation of the present invention will be described with reference to these drawings.

The apparatus according to the present invention is automatically or manually operated. Firstly, electric power of DC 24 V is supplied from the electric power supply member to the PLC CPU (P24 and N24 represent a positive terminal and a negative terminal, respectively, in FIG. 6) and the CPU becomes operational. An original position state is a state in which the forwardly and backwardly moving cylinder 9 is moved backward, the ascending and descending cylinder 10 is moved upward, and the finger driving cylinder 11 is not driven. At this moment, the switches LS1 and LS4 are in a turn-on state.

Under this turn on state, when the printed circuit board 31 is supplied to the automatic insertion machine and the part is automatically inserted and an insertion error occurs, the insertion error is detected by an insertion error detecting device, whereby the insertion error LED 24 on the main control panel 2 is illuminated and also the photocoupler PCR 1' is operated, and the photocoupler PCR 1 is operated whereby an input signal is sent to the PLC. The counter output relay CR3 is turned on according to the control of the PLC, whereby an error number is counted and the erroneously inserted part removing mechanism A is operated, and the forwardly and backwardly moving cylinder 9 moves forwardly, the ascending and descending cylinder 10 descends, and then the finger 19 picks up the detected part according to the driving of the finger driving cylinder 11. At this moment, the servo lock release 25 is not made to be ON/OFF and means LB 3, LB 2 and LB 5 are made to be ON in turn. Thus, when the finger 19 picks up the erroneously inserted part, the photocoupler PCR2' operates and also the PCR2 operates, whereby its signal is inputted to PLC. According to the input signal, the recovery switches 26 and 27 are automatically made to be ON for a few seconds upon the control of PLC and the automatic inserting operation starting switches 28 and 29 are made to be ON. At this moment, when the part gripped by the head of automatic insertion machine is the detected part, a one step operation is executed and the automatic insertion machine is stopped for a few seconds. When it is a different part, the part is thrown away and the part identical to the error part is gripped. Thereafter, a one step operation is executed and thereafter, stopped for few seconds and also the automatic inserting operation starting switches 28 and 29 are made to be OFF.

When the one step operation is finished, the recovery OK LED 30 is illuminated and the next operation is carried out. That is, the recovery ON relay CR5 is made to be turned off and the automatic inserting operation starting relay CR4 is turned on upon the control of PLC so as to execute the continuous automatic inserting operation. After few seconds, it is turned to OFF and then the automatic inserting operation is carried out.

After the erroneous part is removed and the next part is inserted, when the recovery OK LED 30 is extinguished and an inserting error occurs, the operation is repeatedly executed up to three times. When an inserting error still occurs even thereafter, the NG signal lamp 30 is flickered and an operator handles the part manually.

In case of a manual operation, it is performed after connecting the manual operation selecting switch. The reason for connecting executing the manual operation is to confirm whether or not the position determination of the sensor is correct and the like, thereby insuring correct operation at the time of automatic operation.

When the manual selection switch is turned on, irrespective of an insertion error, the forwardly and backwardly moving cylinder 3, ascending and descending cylinder 10, and finger driving cylinder 11 are also operated by a push button switch, respectively.

According to the present invention, it is possible to automatically remove the erroneous part, and the period of time for the erroneously inserted part elimination is remarkably reduced and since operation is possible even without an operator, productivity is improved.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. An apparatus for removing erroneously inserted parts for use in an automatic insertion machine, which apparatus comprises:
   a finger driving cylinder for driving a finger for picking up an erroneously inserted part, said finger driving cylinder being provided with driving confirming means;
   an ascending and descending cylinder for lifting up and lowering said finger, respectively, said ascending and descending cylinder being provided with means for confirming ascension and descention of said finger;
   a forwardly and backwardly moving cylinder for moving said finger forward and backward, said forwardly and backwardly moving cylinder being provided with means for confirming forward and backward movement of said finger;
   an erroneously inserted part removing member having a moving base wherein a part transferring chuck and a part inserting chuck are coupled together and said cylinders are coupled to said moving base for cooperative movement therewith;
   a control member for controlling the operation of said erroneously inserted part removing member;
   a power supply member; and
   an operation and display member including a control panel.

2. The apparatus of claim 1, wherein the erroneously inserted part removing member includes said forwardly and backwardly moving cylinder fixed to a fixing board mounted to said moving base, said moving plate being slidably coupled to a pair of rails fixed on one side of said fixing board and fixed with a plunger of the forwardly and backwardly moving cylinder, said ascending and descending cylinder being mounted to said moving plate, a fixing plate fixed to the lower part of a pair of ascending and descending rods movably mounted at both sides of said moving plate, a plunger provided in connection with the ascending and descending cylinder being fixed to a connecting plate, said connecting plate being movably connected to said fixing plate through a coil spring, and said finger driving cylinder being fixed to said fixing plate and having said finger connected thereto.

3. The apparatus of claim 1, wherein the control member executes a control algorithm comprising:
   illuminating a light emitting diode for indicating an insertion error when an insertion error occurs in automatically inserting parts to a printed circuit board;
   driving said erroneously inserted part removing member, whereby said finger picks up an erroneously inserted part and thereafter, locating said erroneously inserted part removing member to the original position;
   turning on recovery switches for few seconds;
   turning on automatic insertion starting switches,
   inserting a part when the part to be inserted next is a part identical to said erroneously inserted part,
   inserting a part identical to said erroneously inserted part when the inserted part is different from said erroneously inserted part,
   turning off the inserting operation starting switches, illuminating a recovery OK light emitting diode, and turning off recovery switches when the inserting operation is finished,
   executing an automatic inserting operation by turning on automatic inserting operation starting switches and turning off the automatic inserting operation starting switches after a few seconds,
   removing said erroneously inserted part and inserting again another part and then executing repeatedly the removing and inserting operation up to three times when the recovery OK light emitting diode is not illuminated and inserting error occurs, and
   flickering a NG signal lamp when an insertion error occurs again thereafter.

4. The apparatus of claim 1, wherein said control member is a program logic controller.

5. The apparatus of claim 1, wherein said control member is a microprocessor.

* * * * *